(12) United States Patent
Chen et al.

(10) Patent No.: US 8,524,587 B2
(45) Date of Patent: Sep. 3, 2013

(54) NON-UNIFORMITY REDUCTION IN SEMICONDUCTOR PLANARIZATION

(71) Applicant: Taiwan Semiconductor Manufacturing Company, Ltd., Hsin-Chu (TW)

(72) Inventors: Neng-Kuo Chen, Sinshih Township, Tainan County (TW); Jeff J. Xu, Jhubei (TW)

(73) Assignee: Taiwan Semiconductor Manufacturing Company, Ltd., Hsin-Shu (TW)

( * ) Notice: Subject to any disclaimer, the term of this patent is extended or adjusted under 35 U.S.C. 154(b) by 0 days.

(21) Appl. No.: 13/758,084

(22) Filed: Feb. 4, 2013

(65) Prior Publication Data
US 2013/0143410 A1 Jun. 6, 2013

Related U.S. Application Data

(63) Continuation of application No. 12/884,500, filed on Sep. 17, 2010, now Pat. No. 8,367,534.

(51) Int. Cl.
H01L 21/20 (2006.01)

(52) U.S. Cl.
USPC ........... 438/584; 438/430; 438/626; 438/691; 438/697

(58) Field of Classification Search
None
See application file for complete search history.

(56) References Cited

U.S. PATENT DOCUMENTS

| 4,545,852 | A | * | 10/1985 | Barton | 438/699 |
|---|---|---|---|---|---|
| 4,676,867 | A | | 6/1987 | Elkins et al. | |
| 5,272,117 | A | | 12/1993 | Roth et al. | |
| 5,516,729 | A | | 5/1996 | Dawson et al. | |
| 5,560,802 | A | * | 10/1996 | Chisholm | 438/692 |
| 5,920,792 | A | | 7/1999 | Lin | |
| 6,022,788 | A | | 2/2000 | Gandy et al. | |
| 6,140,240 | A | | 10/2000 | Yang et al. | |
| 6,251,788 | B1 | | 6/2001 | Liou | |
| 6,265,315 | B1 | | 7/2001 | Lee et al. | |
| 6,444,581 | B1 | * | 9/2002 | Buschner et al. | 438/689 |
| 6,448,150 | B1 | * | 9/2002 | Tsai et al. | 438/427 |
| 6,617,241 | B1 | | 9/2003 | Doan | |
| 7,651,922 | B2 | * | 1/2010 | Matsuda | 438/427 |
| 2002/0034884 | A1 | | 3/2002 | Whitman et al. | |

* cited by examiner

Primary Examiner — Evan Pert
Assistant Examiner — Andres Munoz
(74) Attorney, Agent, or Firm — Haynes and Boone, LLP

(57) ABSTRACT

Provided is a method of planarizing a semiconductor device. The method includes providing a substrate. The method includes forming a first layer over the substrate. The method includes forming a second layer over the first layer. The first and second layers have different material compositions. The method includes forming a third layer over the second layer. The method includes performing a polishing process on the third layer until the third layer is substantially removed. The method includes performing an etch back process to remove the second layer and a portion of the first layer. Wherein an etching selectivity of the etch back process with respect to the first and second layers is approximately 1:1.

20 Claims, 5 Drawing Sheets

NON-UNIFORMITY REDUCTION IN SEMICONDUCTOR PLANARIZATION

This application is a continuation application of U.S. patent application Ser. No. 12/884,500, filed on Sep. 17, 2010, entitled "Non-Uniformity Reduction In Semiconductor Planarization," the entire disclosure of which is incorporated herein by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs. In the course of integrated circuit evolution, functional density (i.e., the number of interconnected devices per chip area) has generally increased while geometry size (i.e., the smallest component that can be created using a fabrication process) has decreased. This scaling down process generally provides benefits by increasing production efficiency and lowering associated costs.

As semiconductor device sizes continue to shrink, it has become increasingly more difficult to meet device planarization requirements in fabrication. Conventional planarization methods typically involve performing a chemical-mechanical-polishing (CMP) process on a semiconductor wafer. However, these traditional planarization methods have not been able to achieve satisfactory performance for newer technology nodes such as the 15 nanometer (nm) technology node and beyond. As an example, the performance of existing planarization methods tend to suffer from planarization non-uniformity problems when the wafer has regions with different pattern densities.

Therefore, while existing semiconductor device planarization methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
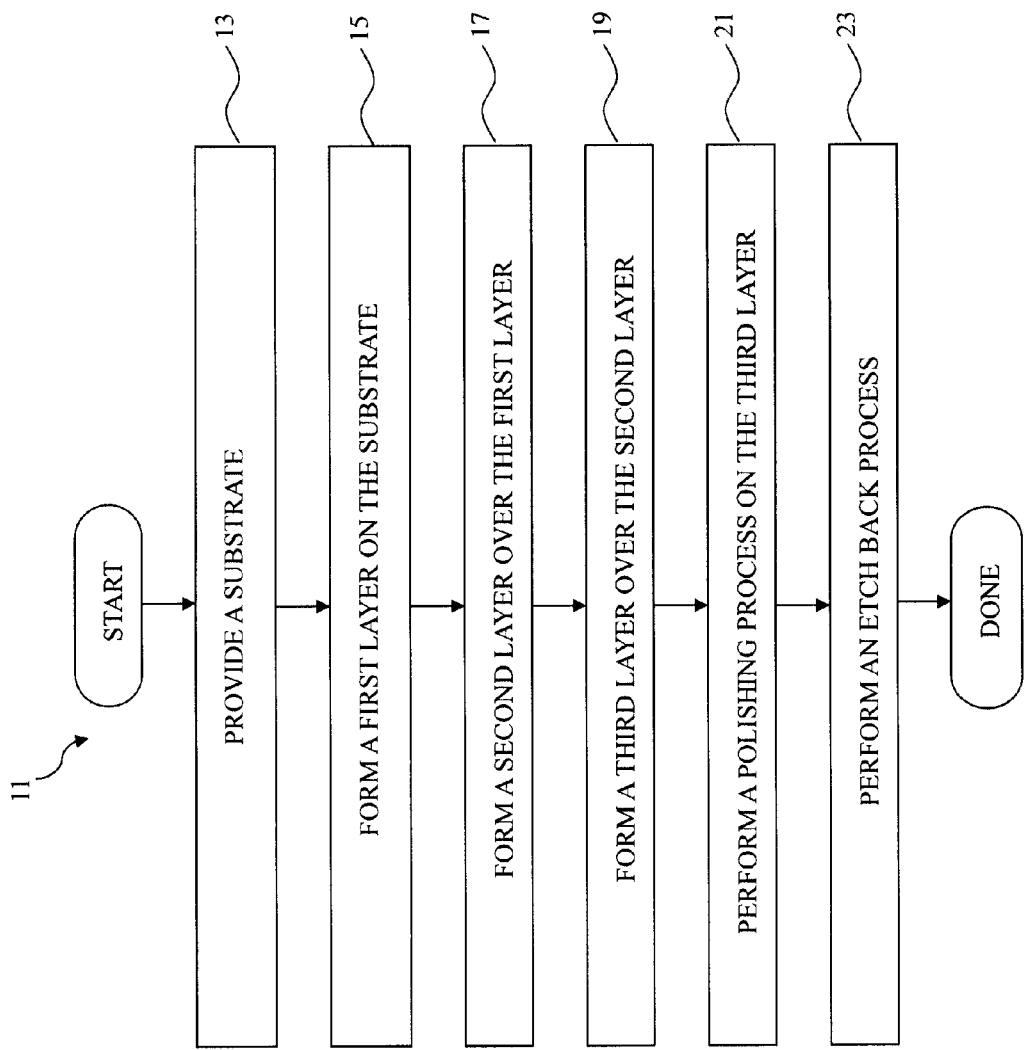
FIG. 1 is a flowchart illustrating a method for planarizing a semiconductor device according to various aspects of the present disclosure.

Illustrated in FIG. 1 is a flowchart of a method 11 for planarizing a semiconductor device according to various aspects of the present disclosure. Referring to FIG. 1, the method 11 begins with block 13 in which a semiconductor substrate is provided. The method 11 continues with block 15 in which a first layer is formed on the substrate. The method 11 continues with block 17 in which a second layer is formed over the first layer. The first and second layers have different material compositions and different polishing rates in a subsequent polishing process. The method 11 continues with block 19 in which a third layer is formed over the second layer. The method 11 continues with block 21 in which a polishing process is performed on the third layer until the third layer is substantially removed. The method 11 continues with block 23 in which an etch back process is performed to remove the second layer and a portion of the first layer. The etching selectivity of the etch back process with respect to the first and second layers is approximately 1:1.

FIGS. 2 to 5 are diagrammatic fragmentary cross-sectional side views of a portion of a semiconductor device 30 at various fabrication stages according to an embodiment of the method 11 of FIG. 1. As an example, the semiconductor device 30 illustrated in FIGS. 2-5 is a portion of a semiconductor wafer. It is understood that FIGS. 2 to 5 have been simplified for a better understanding of the inventive concepts of the present disclosure.

Figure 2:
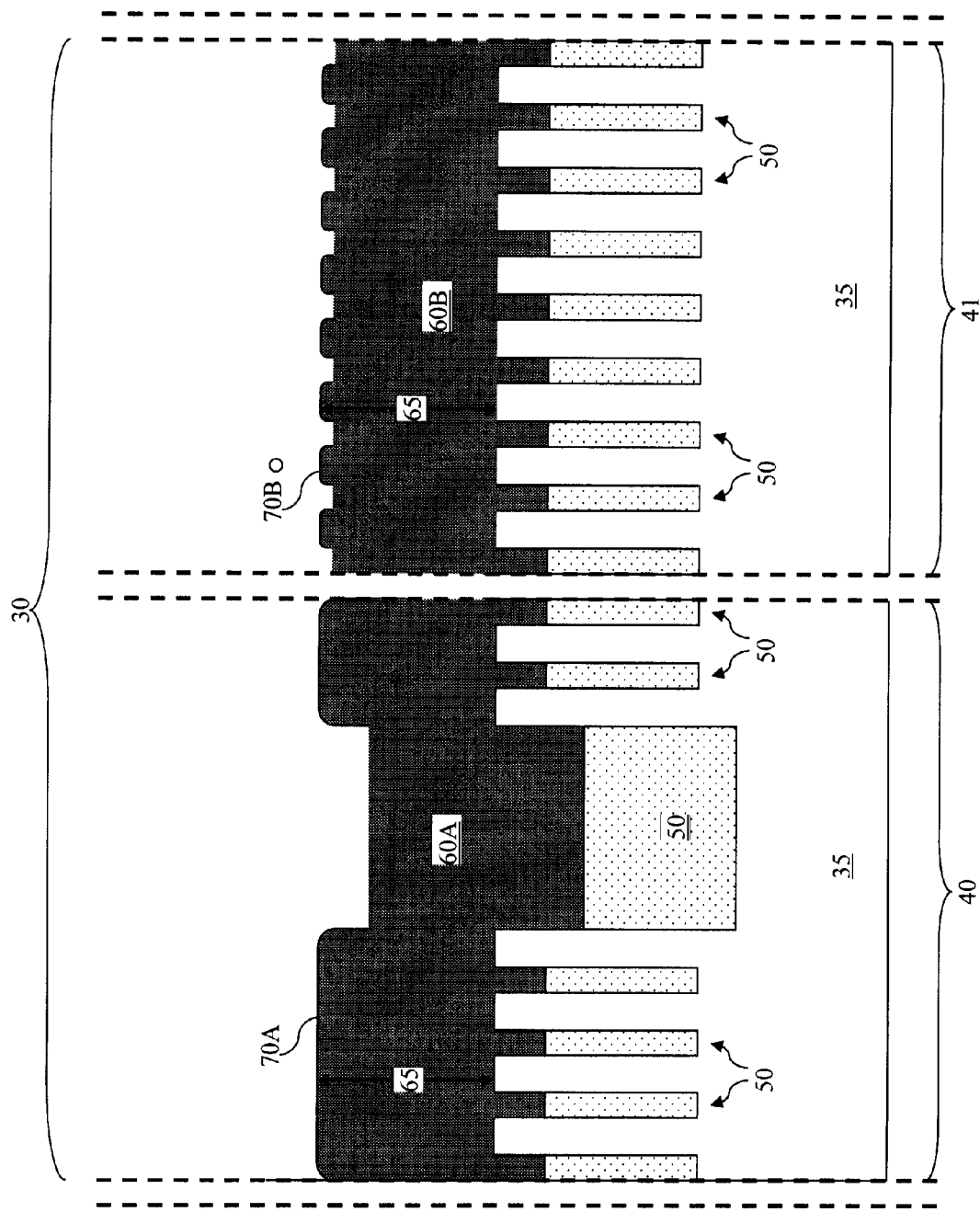
FIGS. 2-5 are diagrammatic fragmentary cross-sectional side views of a semiconductor device at various stages of fabrication in accordance with an embodiment of the method illustrated in FIG. 1.

Referring to FIG. 2, the semiconductor device 30 includes a substrate 35. The substrate 35 is a silicon substrate doped with either a P-type dopant such as boron, or doped with an N-type dopant such as phosphorous or arsenic. The substrate 35 may alternatively include other elementary semiconductors such as germanium and diamond. The substrate 35 may optionally include a compound semiconductor and/or an alloy semiconductor. Further, the substrate 35 may include an epitaxial layer (epi layer), may be strained for performance enhancement, and may include a silicon-on-insulator (SOI) structure.

The substrate 35 has various portions (or regions) with different pattern densities. Pattern density refers to the number of semiconductor features that are disposed within a given region of a wafer. For two wafer regions that are the same in size, one of these regions has a higher pattern density if more semiconductor features are packed into that region than the other region.

For the sake of providing an example, a region 40 and a region 41 of the substrate 35 are shown. These regions 40 and 41 are separated by dashed lines shown in FIG. 2. In an embodiment, the region 41 has a substantially greater pattern density than the region 40. For instance, the region 40 may be a portion of the substrate 35 where test line devices (TCD) are formed. The region 41 may be a portion of the substrate 35 where logic devices are formed, such as Static Random Access Memory (SRAM) devices. It is understood that in other embodiments, the regions 40 and 41 may include other types of devices with varying pattern densities.

Openings may be formed in both regions 40 and 41 of the substrate 35, and a dielectric material 50 is formed to at least partially fill these openings. The dielectric material 50 may be formed using a deposition process known in the art, such as a chemical vapor deposition (CVD) process, a physical vapor deposition (PVD) process, an atomic layer deposition (ALD) process, combinations thereof, or another suitable process. In an embodiment, the dielectric material 50 includes an oxide material.

A layer 60 is then formed over the dielectric material 50. The layer 60 may be formed by a deposition process such as CVD, PVD, ALD, combinations thereof, or another suitable process. The layer 60 has a thickness 65 that is in a range from about 500 angstroms to about 4000 angstroms. In an embodiment, the layer 60 includes a polysilicon material. The polysilicon material may be used later to form various components of the semiconductor device 30, such as a polysilicon gate for a Field Effect Transistor (FET) device. In other embodiments, the layer 60 may include other suitable materials.

For the sake of ease of reference, the portion of the layer 60 formed over the region 40 of the substrate 35 is designated 60A and has an exposed upper surface. The portion of the layer 60 formed over the region 41 of the substrate 35 is designated 60B and has an exposed upper surface 70B. It is also understood that any future reference to layer 60 may mean either the layer 60A, the layer 60B, or both the layers 60A and 60B together.

At this stage of fabrication, the layer 60 may not be flat enough for the later fabrication processes, particularly if the fabrication processes are for a 15-nanometer (nm) technology node or a technology node that is smaller than the 15-nm node. Often times, the surfaces 70A and 70B of the layer 60 may be uneven, rough, and bumpy after the deposition. Subsequent fabrication processes may require the surfaces 70A and 70B to each be relatively flat and smooth, and may require the surfaces 70A and 70B to be substantially co-planar with one another. Traditional methods of planarization of these exposed surfaces 70A and 70B often times fail to accomplish the planarization goals mentioned above. In particular, it may be difficult for traditional planarization methods to ensure that the exposed surfaces 70A and 70B are substantially co-planar. The embodiments of the present disclosure address the shortcomings of the traditional methods, as discussed below.

Figure 3:
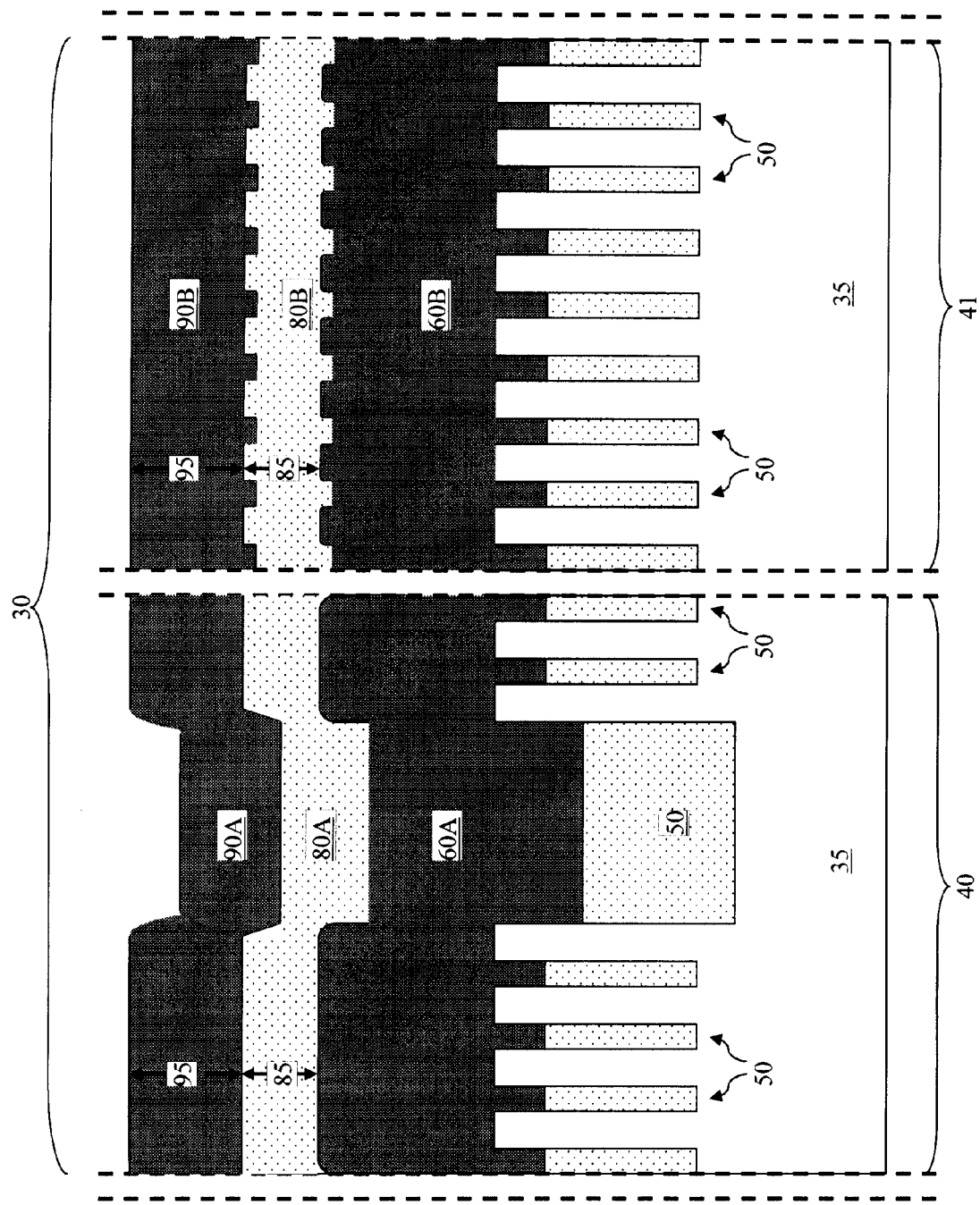

Referring to FIG. 3, a layer 80 is formed over the surfaces 70A and 70B (shown in FIG. 2) of the layer 60. The layer 80 may be formed by a deposition process such as CVD, PVD, ALD, combinations thereof, or another suitable process. For the sake of ease of reference, the portion of the layer 80 formed over the layer 60A is designated 80A, and the portion of the layer 80 formed over the layer 60B is designated 80B. It is also understood that any future reference to layer 80 may mean either the layer 80A, the layer 80B, or both the layers 80A and 80B together.

The layer 80 has a thickness 85 that is in a range from about 20 angstroms to about 200 angstroms. The layer 80 includes a material that is different from the material of the layer 60. In an embodiment, the layer 80 includes a dielectric material, such as an oxide material, a nitride material, or an oxy-nitride material.

Thereafter, a layer 90 is formed over the layer 80. The layer 90 may be formed by a deposition process such as CVD, PVD, ALD, combinations thereof, or another suitable process. For the sake of ease of reference, the portion of the layer 90 formed over the layer 80A is designated 90A, and the portion of the layer 90 formed over the layer 80B is designated 90B. It is also understood that any future reference to layer 90 may mean either the layer 90A, the layer 90B, or both the layers 90A and 90B together.

The layer 90 has a thickness 95 that is in a range from about 300 angstroms to about 3000 angstroms. The layer 90 includes a material that is different from the material of the layer 80. In an embodiment, the layer 90 includes the a substantially identical material as the layer 60. In other words, the layers 60 and 90 may have substantially identical material compositions.

Figure 4:
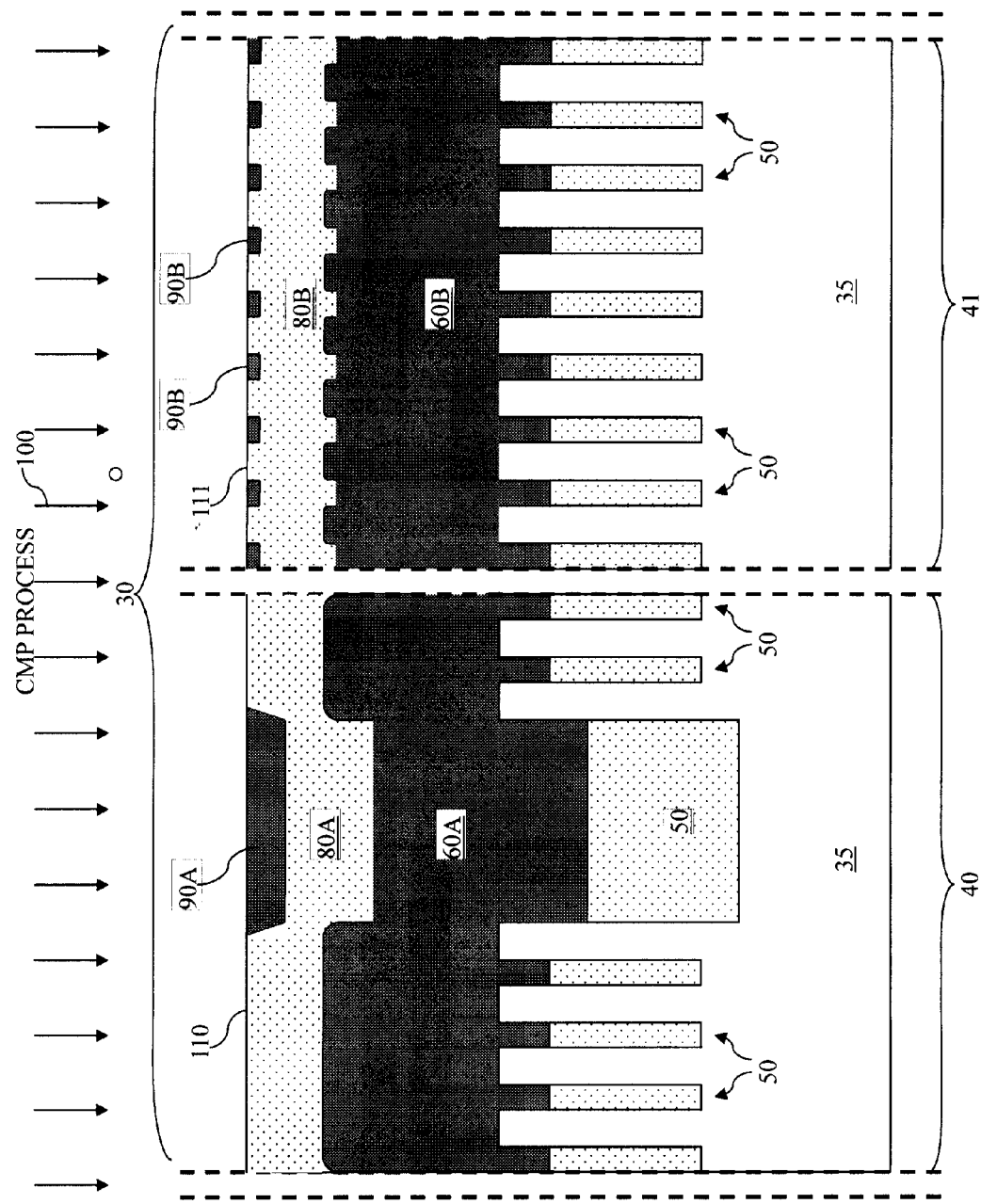

Referring now to FIG. 4, a chemical-mechanical-polishing (CMP) process 100 is performed on the semiconductor device 30 to remove the layer 90. Since the region 40 of the substrate 35 has a lower pattern density compared to the region 41, the CMP process 100 polishes away the layer 90A at a faster rate than it polishes away the layer 90B. For example, when the layer 90A has been substantially polished away (leaving only a portion 90A that fills a concave opening of the layer 80A), the layer 90B may still be a few hundred angstroms thick. However, in the embodiment illustrated in FIG. 4, the layer 80 serves as a polish-stop layer. The material of the layer 80 is selected to have a substantially different polishing rate than the material of the layer 90. Therefore, the layer 80A protects the layer 60A therebelow during the CMP process 100, even after most of the layer 90A has been polished away. Stated differently, the CMP process 100 cannot progress further with respect to the layers below the layer 80A once it reaches the layer 80A.

Meanwhile, the CMP process 100 continues to polish away the layer 90B. Eventually, most of the layer 90B is polished away by the CMP process 100 as well, leaving only small portions of 90B filling the various concave openings of the layer 80B. At this point, both the layers 80A and 80B are reached by the CMP process 100 and become substantially exposed. The layer 80A has a surface 110, and the layer 80B has a surface 111 that is substantially co-planar with the surface 110. In an embodiment, a total surface variation for the surfaces 110 and 111 combined is less than about 100 angstroms, wherein a total surface variation is defined as the difference between a highest point of a surface and a lowest point of the surface. Thus, despite the different polishing rates as a result of the different pattern densities, the CMP process 100 will not cause surface non-uniformity between the layers overlying the region 40 and the layers overlying the region 41.

Figure 5:
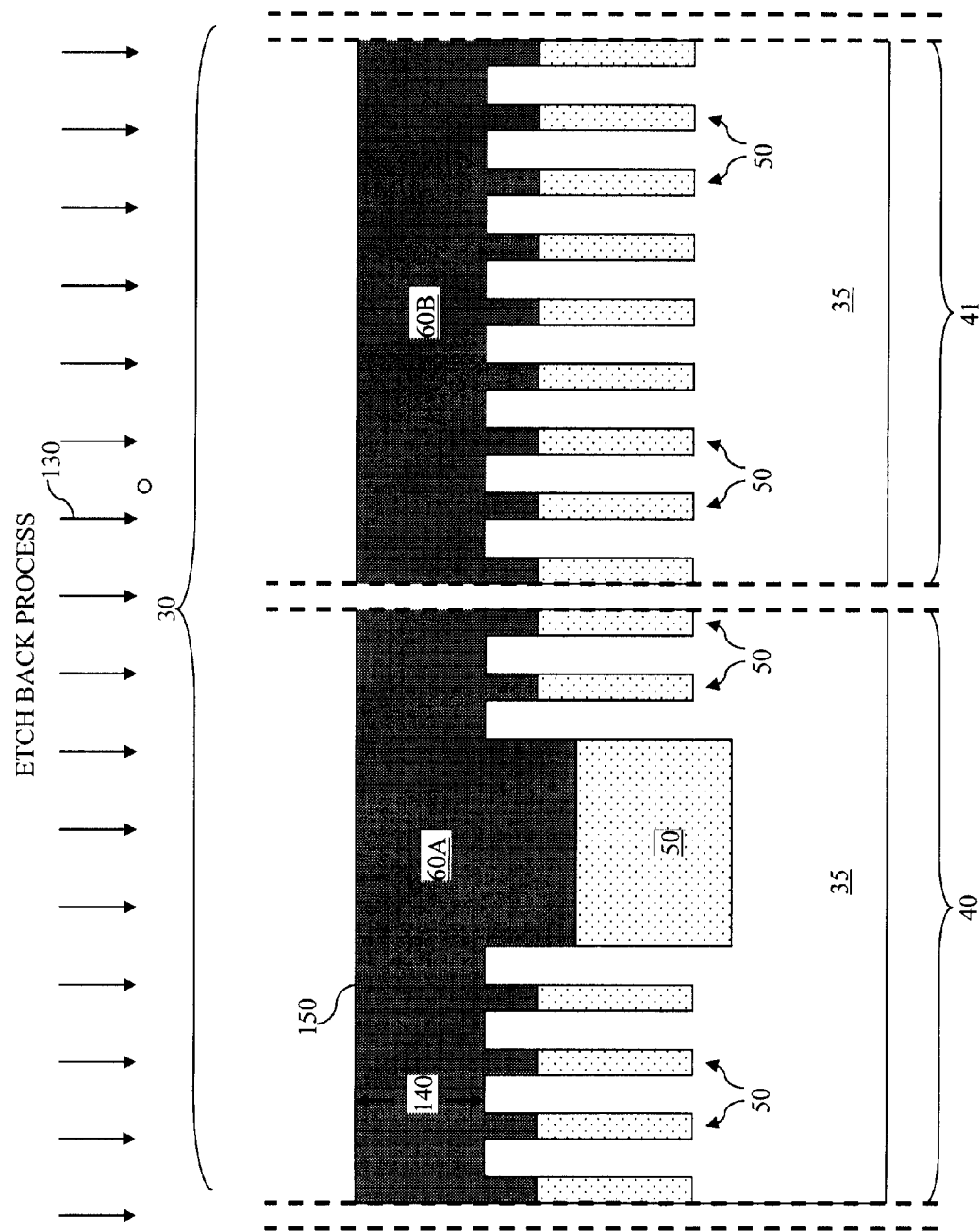

Referring to FIG. 5, an etch back process 130 (may also be referred to an etching back process) is performed to remove the layer 80, the remaining portions of the layer 90 after the CMP process 100, and a portion of the layer 60. The etch back process 160 is tuned in a manner such that it has an etching selectivity of substantially 1:1 with respect to the layers 60 and 80 (and also layers 80 and 90). In other words, the layers 60 and 80 have substantially identical etching rates. Thus, the layers 60 and 80 may be etched away at the same rate, as if they are of the same material. In an embodiment, the etch back process 130 is a plasma dry etching process and includes the following process parameters (among others):

an etchant that includes a gas mixture of tetrafluoromethane ($CF_4$) and trifluoromethane ($CHF_3$), wherein a ratio of the $CF_4$ gas and the $CHF_3$ gas is in a range from about 0 to about 1;

a radio-frequency (RF) power that is in a range from about 200 watts to about 600 watts; and a bias voltage from about 50 volts to about 250 volts.

A predetermined amount of the layer 60 may be etched away by tuning the parameters of the etch back process 130, for example by changing etching time. After the etch back process 130 is performed, the remaining portion of the layer 60 has a thickness 140 that is in a range from about 300 angstroms to about 1500 angstroms. This remaining portion of the layer 60 has an exposed upper surface 150.

As discussed above, due to the 1:1 etching selectivity of the etch back process 130, the layer 60 and 80 are etched away at the same rate. In this manner, the substantially flat profile of the surface 110 (FIG. 4, prior to the etch back process 130) is preserved and transferred to the surface 150 after the portion of the layer 60 has been etched away. Therefore, the surface 150 of the layer 60 also takes on a substantially flat or planar profile and may have a total surface variation that is less than about 100 angstroms.

The processed discussed above may be used to achieve substantial planar profile for desired layers. The processes discussed above may also be used to substantially reduce or eliminate surface non-uniformity between different regions of a wafer as a result of these regions having different pattern densities. In one of the embodiments discussed above, the desired flat and planar layer (for example, layer 60) is a polysilicon layer. However, in other embodiments, the desired flat and planar layer may also be an inter-layer dielectric (ILD) layer that is a part of an interconnect structure. In other words, the processes described above may also be used to form an ILD layer having a surface that is substantially flat and uniform throughout different regions of the wafer, even if these different regions have substantially different pattern densities. The ILD layer may include dielectric materials such as oxide, nitride, a low-k dielectric material, or another suitable material.

It is also understood that additional processes may be performed to complete the fabrication of the semiconductor device 30. For example, various active or passive components may be formed in the substrate 35. An interconnect structure may be formed to electrically couple these components and to establish electrical connections with external devices. The wafers containing the semiconductor device 30 may also undergo passivation, slicing, and packaging processes.

The embodiments of the present disclosure discussed above have advantages over existing methods. It is understood, however, that other embodiments may have different advantages, and that no particular advantage is required for all embodiments. One of the advantages is that a substantially planar surface of a layer (such as a polysilicon layer or an ILD layer) may be achieved for cutting edge semiconductor fabrication technologies, such as for the 15-nm technology node or other technology nodes beyond the 15-nm node. The substantially planar surface may have a total surface variation of less than about 100 angstroms, which is much better than what can be achieved using existing planarization techniques.

Another advantage is that substantial polishing uniformity may be achieved. Traditionally, when a polishing process is performed on a wafer having various regions with different pattern densities, the polishing rates are different as well. Consequently, the resulting wafer surface after the polishing process is performed will not be coplanar—the region with the greater pattern density will have a higher surface than the region with the lower pattern density. In comparison, the embodiments disclosed herein allow for substantial reduction or elimination of surface non-uniformity, despite having different regions with different pattern densities.

Another advantage is that the embodiments disclosed herein are compatible with a Complementary Metal Oxide Semiconductor (CMOS) process flow. Thus, the embodiments disclosed herein can be implemented inexpensively and without causing significant disruptions for current fabrication process flows. As an example, the materials used for the polishing-stop layer may include a dielectric material, which can be easily formed using current fabrication equipment.

One of the broader forms of the present disclosure involves a method. The method includes: providing a substrate; forming a first layer on the substrate; forming a second layer over the first layer, the first and second layers having different material compositions; forming a third layer over the second layer; performing a polishing process on the third layer until the third layer is substantially removed; and performing an etch back process to remove the second layer and a portion of the first layer, wherein an etching selectivity of the etch back process with respect to the first and second layers is approximately 1:1.

Another of the broader forms of the present disclosure involves a method. The method includes: providing a wafer having a first region and a second region, the first and second regions having different pattern densities; forming a first layer over the first and second regions of the wafer; forming a second layer on the first layer; forming a third layer on the second layer; polishing away the third layer until portions of the second layer overlying both the first and second regions are reached, the second layer serving as a polishing-stop layer; and etching back the second layer and a portion of the first layer, wherein the first and second layers have substantially identical etching rates.

Still another of the broader forms of the present disclosure involves a method. The method includes: providing a substrate, wherein the substrate includes portions having different pattern densities; forming a first layer over the portions of the substrate having the different pattern densities, wherein the first layer includes a material selected from the group consisting of: polysilicon and inter-layer dielectric; forming a second layer over the first layer, wherein the first and second layers have different polishing rates; forming a third layer over the second layer; performing a chemical-mechanical-polishing (CMP) process on the third layer, wherein the second layer functions as a stop layer for the CMP process; and performing an etch back process to remove the second layer and a portion of the first layer, wherein an etching selectivity of the etch back process with respect to the first and second layers is approximately 1:1.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:

forming a first layer over a first region and a second region of a substrate, the first and second regions having different pattern densities;

forming a second layer over the first layer, the first and second layers containing different materials;

forming a third layer over the second layer, the third and second layers containing different materials;

polishing the third layer, the second layer serving as a polishing-stop layer during the polishing, wherein remaining portions of the third layer and the second layer collectively form a substantially planar surface at an end of the polishing; and thereafter removing the remaining portions of the third layer and the second layer and a portion of the first layer, wherein a remaining portion of the first layer after the removing maintains a substantially planar surface.

2. The method of claim 1, wherein the removing includes an etch back process having an etching selectivity of approximately 1:1 with respect to the first and second layers.

3. The method of claim 2, wherein the etch back process has an etching selectivity of approximately 1:1 with respect to the second and third layers.

4. The method of claim 2, wherein the etch back process includes the following process parameters:
an etchant that includes a gas mixture of tetrafluoromethane ($CF_4$) and trifluoromethane ($CHF_3$), wherein a ratio of the $CF_4$ gas and the $CHF_3$ gas is in a range from about 0 to about 1;
a radio-frequency (RF) power that is in a range from about 200 watts to about 600 watts; and
a bias voltage from about 50 volts to about 250 volts.

5. The method of claim 1, wherein the substantially planar surface of the first layer after the removing has a total surface variation that is less than about 100 Angstroms.

6. The method of claim 1, wherein the first and third layers have substantially identical material compositions.

7. The method of claim 1, wherein:
the first layer includes a polysilicon material;
the second layer includes a dielectric material; and
the third layer includes a polysilicon material.

8. The method of claim 1, wherein:
the first layer includes a first dielectric material;
the second layer includes a second dielectric material that is different from the first dielectric material; and
the third layer includes the first dielectric material.

9. The method of claim 1, wherein:
the first layer has a first thickness in a range from about 500 Angstroms to about 4000 Angstroms;
the second layer has a second thickness in a range from about 20 Angstroms to about 200 Angstroms; and
the third layer has a third thickness in a range from about 300 Angstroms to about 3000 Angstroms.

10. The method of claim 1, further comprising: performing a 15-nm semiconductor fabrication process to the first layer.

11. A method of fabricating a semiconductor device, comprising:
forming a first layer over a wafer that has a plurality of regions having non-uniform pattern densities;
forming a second layer over the first layer, the first and second layers having different material compositions;
forming a third layer over the second layer, the second and third layers having different material compositions, the third and first layers having substantially similar material compositions;
planarizing the third layer while the second layer serves as a polishing-stop layer, wherein the second layer and remaining portions of the third layer collectively have a total surface variation of less than about 100 Angstroms; and
etching back the second layer and a portion of the first layer until a predetermined thickness for a remaining portion of first layer has been reached, wherein the remaining portion of the first layer has a surface profile substantially similar to a collective surface of the second layer and the remaining portions of the third layer after the planarizing.

12. The method of claim 11, wherein the first and second layers have substantially identical etching rates during the etching back process.

13. The method of claim 12, wherein the etching back process includes the following process parameters:
an etchant that includes a gas mixture of tetrafluoromethane ($CF_4$) and trifluoromethane ($CHF_3$), wherein a ratio of the $CF_4$ gas and the $CHF_3$ gas is in a range from about 0 to about 1;
a radio-frequency (RF) power that is in a range from about 200 watts to about 600 watts; and
a bias voltage from about 50 volts to about 250 volts.

14. The method of claim 11, wherein:
the first layer includes a polysilicon material;
the second layer includes a dielectric material; and
the third layer includes a polysilicon material.

15. The method of claim 11, wherein:
the first layer includes a first dielectric material;
the second layer includes a second dielectric material that is different from the first dielectric material; and
the third layer includes the first dielectric material.

16. The method of claim 11, wherein:
the first layer has a first thickness in a range from about 500 Angstroms to about 4000 Angstroms;
the second layer has a second thickness in a range from about 20 Angstroms to about 200 Angstroms; and
the third layer has a third thickness in a range from about 300 Angstroms to about 3000 Angstroms.

17. The method of claim 11, wherein the semiconductor device is fabricated using a 15-nm technology node.

18. A method of planarizing a semiconductor device to make it suitable for a 15-nm technology node or smaller, comprising:
forming a first layer over a first region and a second region of a substrate, the first and second regions having different pattern densities, wherein the first layer has a first thickness in a range from about 500 Angstroms to about 4000 Angstroms;
forming a second layer over the first layer, the first and second layers containing different materials, wherein the second layer has a second thickness in a range from about 20 Angstroms to about 200 Angstroms;
forming a third layer over the second layer, the third and second layers containing different materials, the third and first layers containing substantially identical materials, wherein the third layer has a third thickness in a range from about 300 Angstroms to about 3000 Angstroms;
performing a polishing process to the third layer, the second layer serving as a polishing-stop layer during the polishing process, wherein remaining portions of the third layer and the second layer collectively form a surface having a surface variation of less than about 100 Angstroms at a completion of the polishing process; and
thereafter performing an etch back process to the first, second, and third layers until a remaining portion of the first layer reaches a predetermined thickness level, wherein the remaining portion of the first layer has a surface variation of less than about 100 Angstroms at a completion of the etch back process, and wherein the etch back process includes the following process parameters:
an etchant that includes a gas mixture of tetrafluoromethane ($CF_4$) and trifluoromethane ($CHF_3$), wherein a ratio of the $CF_4$ gas and the $CHF_3$ gas is in a range from about 0 to about 1;
a radio-frequency (RF) power that is in a range from about 200 watts to about 600 watts; and
a bias voltage from about 50 volts to about 250 volts.

19. The method of claim 18, wherein:
the first layer includes a polysilicon material;
the second layer includes a dielectric material; and
the third layer includes a polysilicon material.

20. The method of claim 18, wherein:
the first layer includes a first dielectric material;
the second layer includes a second dielectric material that is different from the first dielectric material; and
the third layer includes the first dielectric material.

* * * * *